United States Patent
Sudjian

(10) Patent No.: US 6,737,899 B2
(45) Date of Patent: May 18, 2004

(54) HIGH-SPEED LATCH WITH INTEGRATED GATE

(75) Inventor: Douglas Sudjian, Santa Clara, CA (US)

(73) Assignee: Resonext Communications, Inc., San Jose, CA (US)

( * ) Notice: Subject to any disclaimer, the term of this patent is extended or adjusted under 35 U.S.C. 154(b) by 210 days.

(21) Appl. No.: 09/792,890

(22) Filed: Feb. 23, 2001

(65) Prior Publication Data

US 2003/0141912 A1 Jul. 31, 2003

(51) Int. Cl.⁷ ............................................. H03K 3/356
(52) U.S. Cl. .................................... 327/208; 327/212
(58) Field of Search ................................. 327/199–203, 327/208–212, 214, 215, 218, 55, 57

(56) References Cited

U.S. PATENT DOCUMENTS

| | | | | |
|---|---|---|---|---|
| 4,276,488 A | * | 6/1981 | Benedict et al. | ............ 327/202 |
| 5,563,533 A | * | 10/1996 | Cave et al. | .................... 327/55 |
| 5,796,273 A | * | 8/1998 | Jung et al. | ..................... 327/55 |
| 5,892,382 A | * | 4/1999 | Ueda et al. | .................. 327/199 |
| 5,903,175 A | * | 5/1999 | Miyashita | .................... 327/199 |
| 6,107,853 A | * | 8/2000 | Nikolic et al. | .............. 327/217 |

\* cited by examiner

*Primary Examiner*—Toan Tran
(74) *Attorney, Agent, or Firm*—Dinh & Associates

(57) ABSTRACT

Techniques to improve the operating speed and switching performance of a latch having an integrated gate. In one design, the latch includes first and second differential amplifiers and a feedback circuit (e.g., a third differential amplifier). The first differential amplifier has a number of non-inverting inputs (e.g., configured to implement an OR function) and an inverting input, receives and senses input signals applied to the non-inverting inputs during a "sensing" phase, and provides a differential output. The second differential amplifier latches the output during a "latching" phase. The feedback circuit detects the non-inverting output and provides a control signal for the inverting input of the first differential amplifier. The feedback circuit can provide positive feedback, and can dynamically adjust the inverting input to provide improved switching performance. A fourth differential amplifier receives a differential clock signal, and activates the first and second differential amplifiers during the sensing and latching phases, respectively.

19 Claims, 12 Drawing Sheets

HIGH-SPEED LATCH WITH INTEGRATED GATE

BACKGROUND OF THE INVENTION

The present invention relates generally to circuits. More particularly, it relates to a high-speed latch with integrated gate, which has improved switching performance and may be used in various applications such as a prescaler for a frequency synthesizer.

Latches and gates are commonly used to implement various logic functions. For example, latches may be used to implement flip-flops, which may then be used with gates to implement a dual modulus divider capable of dividing an oscillator signal by one of two (or possibly more) divide factors. An example design of such dual modulus divider is described below. For some applications (e.g., wireless, networking, and so on), the oscillator signal may be a radio frequency (RF) signal. The dual modulus divider is typically the fast operating logic on a device, and may be required to operate based on the RF signal. In this case, if the dual modulus divider can be designed to operate faster, a higher oscillator frequency may be supported and new applications may be possible.

To increase the operating speed of the dual modulus divider, it is necessary to reduce the propagation delay between flip-flops. If a gate is inserted between stages of the flip-flop, additional delay is introduced which then limits the speed at which the flip-flops may be triggered. To reduce the propagation delay, the gate may be integrated within the appropriate flip-flop. However, as described in further detail below, the integration of the gate within the flip-flop typically results in an input stage that is a single-ended design (as oppose to a differential design) having degraded switching performance.

As can be seen, a high-speed latch having an integrated gate and improved switching performance is highly desirable. This latch with integrated gate may be advantageous used for various high-speed logic circuits, such as a prescaler, required to operate at a high clock frequency.

SUMMARY OF THE INVENTION

The invention provides techniques to improve the operating speed and switching performance of a latch having an integrated gate. Via the use of a (positive) feedback circuit, various improvements in performance may be obtained such as (1) faster signal swing on the output signal, (2) stronger output signal drive, (3) improved noise margin, and so on. The feedback circuit may be used to implement high-speed logic based on, for example, current-mode logic (CML). The improvements provided by the feedback circuit are especially advantageous for logic circuit implemented in complementary metal oxide semiconductor (CMOS), which is inherently a slower process than some other processes such as bipolar and bipolar-CMOS.

An embodiment of the invention provides a latch that includes first and second differential amplifiers and a feedback circuit. The first differential amplifier has a number of first (e.g., non-inverting) inputs and a second (e.g., inverting) input, receives and senses the input signals applied to the non-inverting inputs during a "sensing" phase of the latch, and provides a differential output. The non-inverting inputs may correspond to the gates of a number of transistors coupled in parallel to form, e.g., an OR function. The second differential amplifier latches the differential output during a "latching" phase of the latch. The feedback circuit detects the (e.g., non-inverting node of the) differential output and provides a control signal for the inverting input of the first differential amplifier. The latch typically further includes a fourth differential amplifier that receives a differential clock signal, activates the first differential amplifier during the sensing phase, and activates the second differential amplifier during the latching phase.

The feedback circuit can provide positive feedback between the output of the latch and the inverting input of the first differential amplifier. This feedback can provide various improvements in the output signal characteristics. For example, the control signal can dynamically adjust the inverting input of the first differential amplifier to provide improved switching performance. This dynamic adjustment can be achieved by driving the inverting input to a polarity that is opposite from a voltage generated by the OR of the input signals applied to the non-inverting inputs.

The feedback circuit can be implemented with a third differential amplifier comprised of a pair of transistors having sources that couple together. One transistor has a gate that couples to the inverting output of the latch and a drain that couples to the inverting input of the first differential amplifier. The other transistor has a gate that can couple to a bias voltage, $V_B$, or to the non-inverting output of the latch, and a drain that can couple to a resistive or active load or the supply voltage, $V_{CC}$.

Another embodiment of the invention provides a dual modulus divider (which may be used for a prescaler in a frequency synthesizer). The dual modulus divider includes a number of flip-flops coupled in series. Each flip-flop receives one or more input signals at a data input, registers the one or more input signals with a clock signal received at a clock input, and provides an output signal. At least one flip-flop includes an integrated gate at its data input. Each flip-flop with an integrated gate includes a feedback circuit configured to provide a control signal that improves the switching performance of the flip-flop. For example, the flip-flop may include a latch that may be designed in the manner described above. The dual modulus divider may include, for example, three flip-flops and may be configurable to divide the input clock signal by one of a number of divider ratios (e.g., 4 and 5).

Various other aspects, embodiments, and features of the invention are also provided, as described in further detail below.

The foregoing, together with other aspects of this invention, will become more apparent when referring to the following specification, claims, and accompanying drawings.

DESCRIPTION OF THE SPECIFIC EMBODIMENTS

Figure 1A:
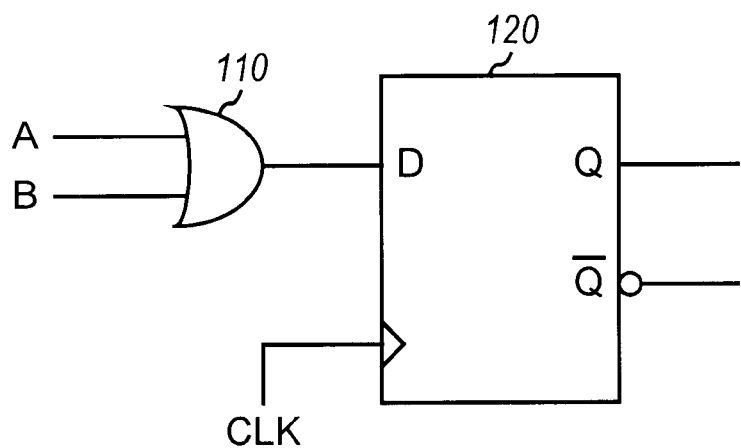
FIGS. 1A and 1B are simple diagrams of an OR gate coupled to a D flip-flop, which is implemented with two latches.

FIG. 1A is a simple diagram of an OR gate 110 coupled to a D flip-flop 120. This basic configuration is used in many logic circuits and for numerous applications, one of which is described in further detail below. OR gate 110 receives two input signals, A and B, and provides an ORed output to the data (D) input of flip-flop 120.

Figure 1B:
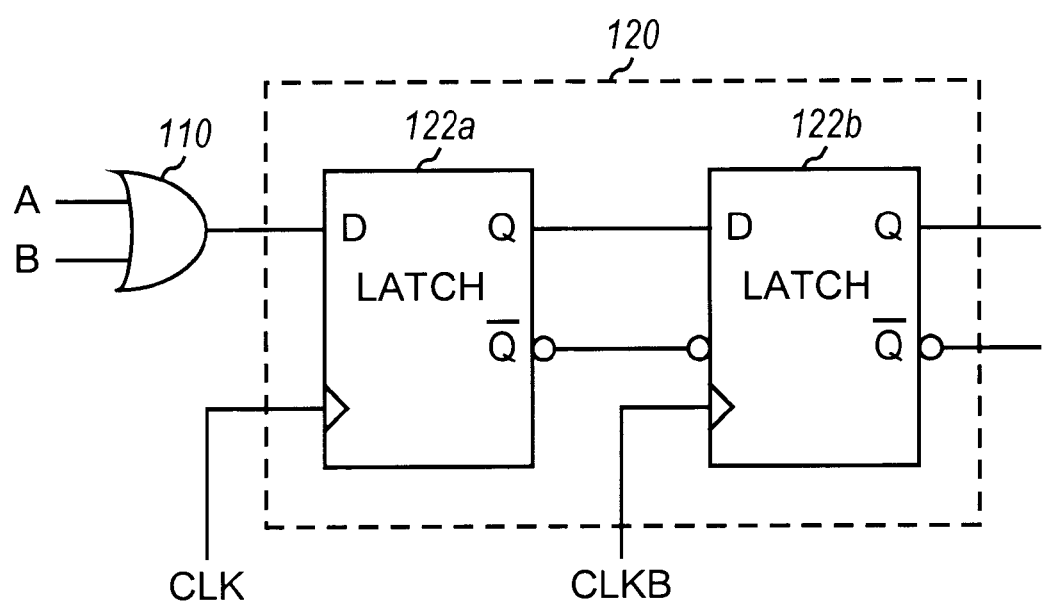

FIG. 1B is a more detailed diagram of OR gate 110 and D flip-flop 120. As shown in FIG. 1B, D flip-flop 120 includes two latches 122a and 122b coupled in series. Latch 122a has a data input that couples to the output of OR gate 110 and an output that couples to the data input of latch 122b. The output of latch 122b comprises the output of D flip-flop 120. Latch 122a receives the clock signal, CLK, and latch 122b receives the complementary clock signal, CLKB.

Figure 2:
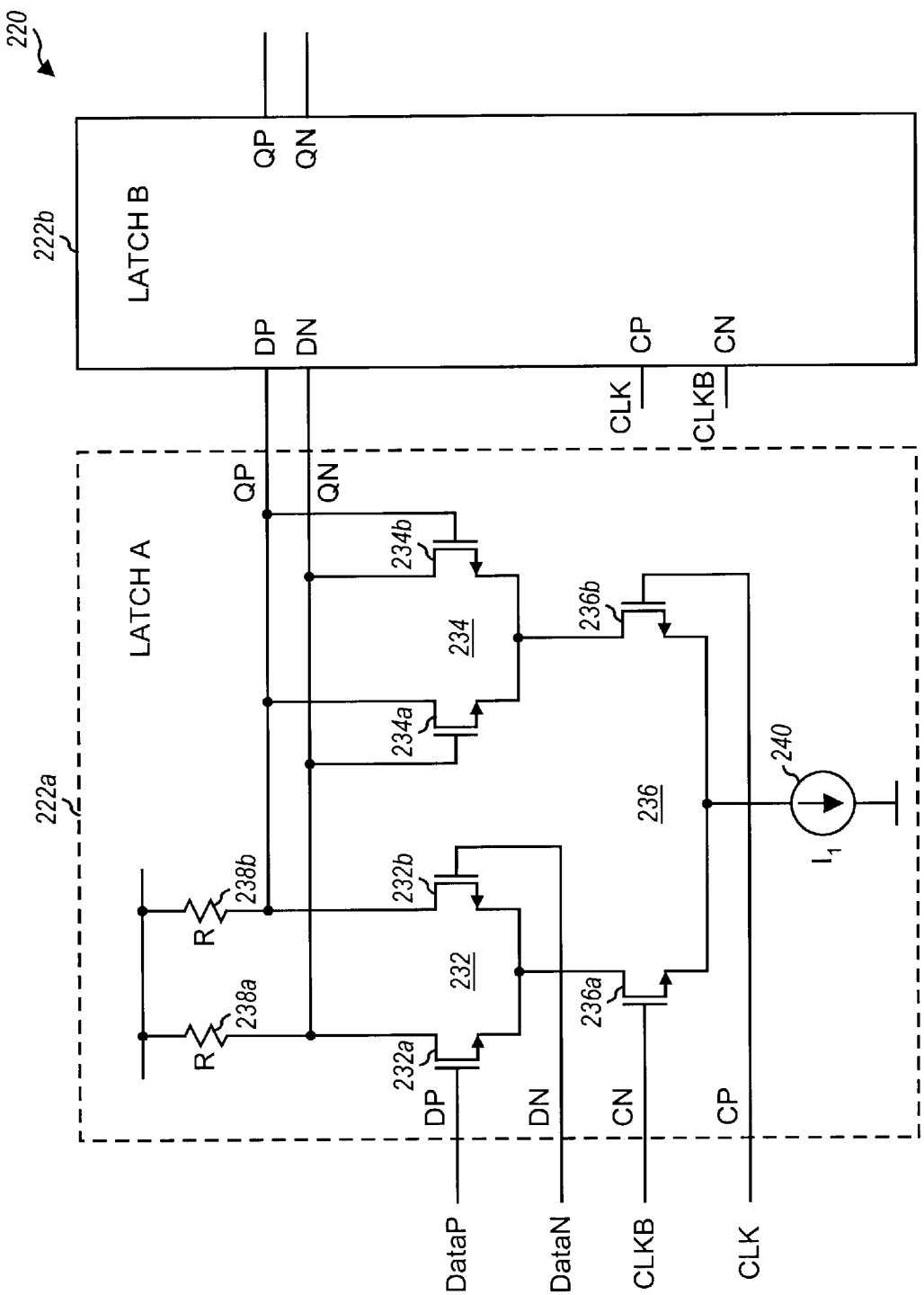
FIG. 2 is a schematic diagram of a specific design of a D flip-flop, which is one implementation of the D flip-flop shown in FIGS. 1A and 1B.

FIG. 2 is a schematic diagram of a specific design of a D flip-flop 220, which is one implementation of D flip-flop 120 in FIGS. 1A and 1B. In this design, D flip-flop 220 is implemented with complementary metal oxide semiconductor (CMOS) transistors and based on current-mode logic (CML). CMOS is preferred for many circuits because of its lower cost. However, CMOS typically has slower operating frequency in comparison to other processes such as bipolar, bipolar-CMOS (Bi-CMOS), and others. Current-mode logic is often used to implement logic circuits when faster operating speed is desired (for a given process).

As shown in FIG. 2, D flip-flop 220 includes two latches 222a and 222b coupled in series. Each latch 222 includes an "input" differential amplifier 232, a latching "output" differential amplifier 234, and a clocked current-steering differential amplifier 236. Input differential amplifier 232 includes N-channel transistors 232a and 232b having sources that couple together, gates that form the differential data input, DP and DN, and drains that respectively couple to load resistors 238a and 238b.

Output differential amplifier 234 includes N-channel transistors 234a and 234b having sources that couple together, gates that respectively couple to QN and QP, and drains that respectively couple to QP and QN, to form the differential latch output, QN and QP. Current-steering differential amplifier 236 includes N-channel transistors 236a and 236b having sources that couple together and to a current source 240, gates that form the differential clock input, CP and CN, and drains that couple to the sources of differential amplifiers 232 and 234, respectively.

Latch 222a operates as follows. On the "sensing" phase of the clock signal CLK (i.e., the voltage on CN is greater than the voltage on CP), N-channel transistor 236a is turned on and N-channel transistor 236b is turned off, which effectively "activates" differential amplifier 232 and "deactivates" differential amplifier 234. In this state, the differential data input signal, DATAP and DATAN, is able to drive differential amplifier 232, and the value on the differential latch output, QP and QN, is dependent on the value on the differential data input signal.

When the clock signal CLK switches to the "latching" phase, (i.e., the voltage on CN is less than the voltage on CP), N-channel transistor 236a is turned off and N-channel transistor 236b is turned on, which effectively deactivates differential amplifier 232 and activates differential amplifier 234. In this state, the differential data input signal, DATAP and DATAN, has no affect on the latch output, QP and QN. The value previously provided on the latch output during the sensing phase is maintained by output differential amplifier 234 during the latching phase.

Referring back to FIG. 1B, for some applications (one of which is described below), it is highly desirable to integrate OR gate 110 into input latch 122a. If OR gate 110 is implemented as a separate gate, additional delay is introduced by the propagation delay of the OR gate. For high-speed applications, the additional delay may limit the frequency at which D flip-flop 120 may be operated. Furthermore, the additional delay introduced by OR gate 110 may be more detrimental for CMOS design having inherently slower operating speed in comparison to other (e.g., bipolar) designs.

Figure 3:
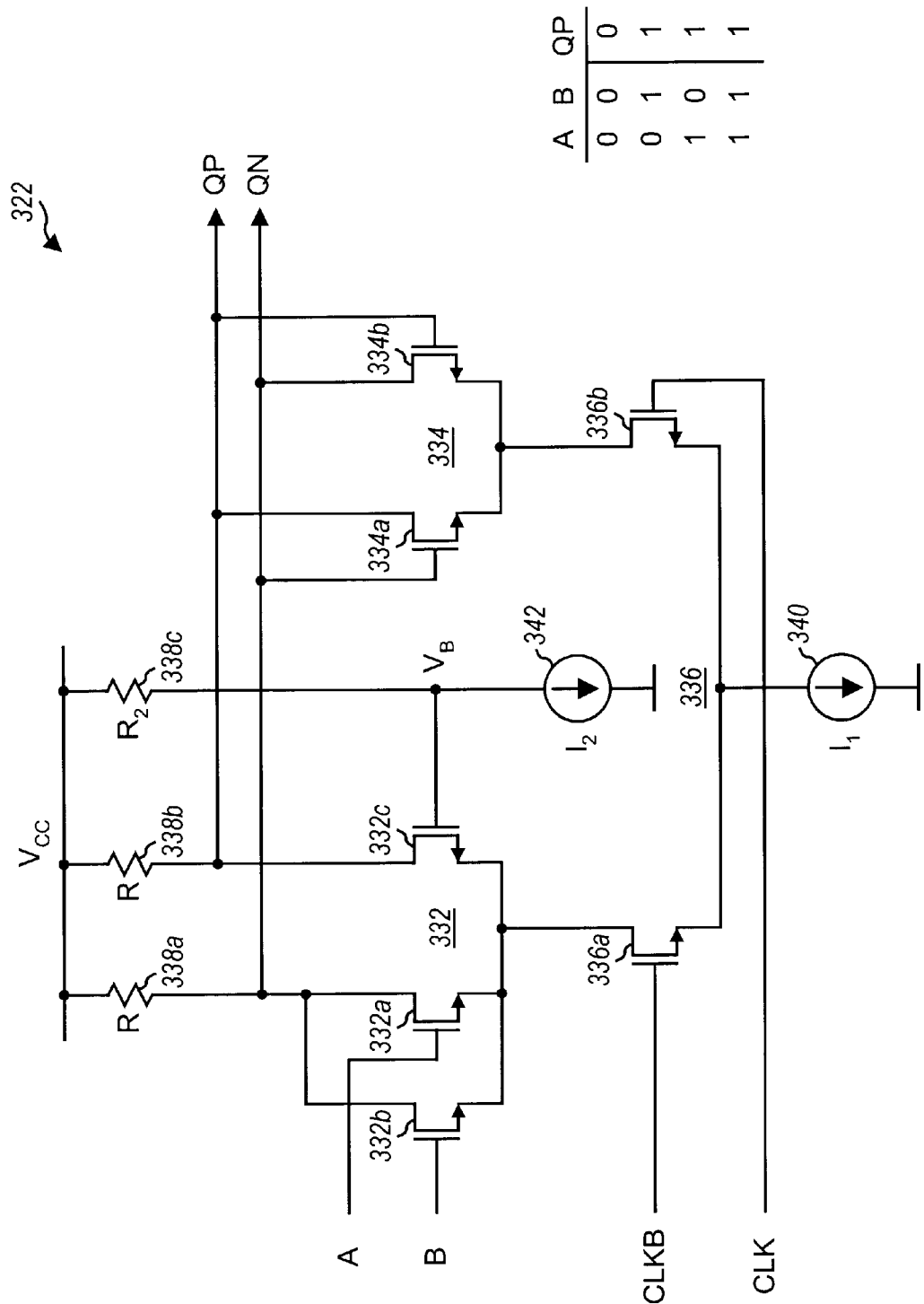
FIG. 3 is a schematic diagram of a design of a latch with an integrated 2-input OR gate.

FIG. 3 is a schematic diagram of a design of a latch 322 with an integrated 2-input OR gate. Latch 322 includes an input differential amplifier 332, an output differential amplifier 334, and a clocked current-steering differential amplifier 336, which are similar to those for latch 222a in FIG. 2. However, input differential amplifier 332 includes a pair of N-channel transistors 332a and 332b coupled in parallel on one side of the differential amplifier, and a single N-channel transistor 332c on the other side. The bases of N-channel transistors 332a and 332b form the two inputs of the OR gate and receive the input signals A and B, respectively. The base of N-channel transistor 332c couples to a load resistor 338c and a current source 342.

Figure 4A:
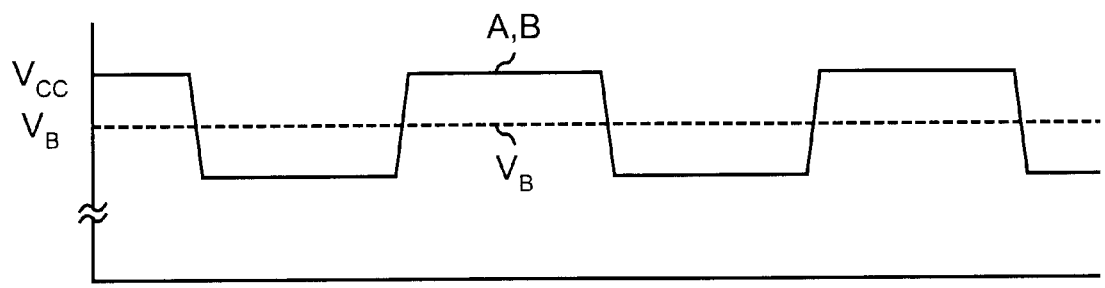
FIG. 4A is a diagram showing the voltages at the inputs of a "single-ended" differential amplifier.

FIG. 4A is a diagram showing the voltages at the inputs of differential amplifier 332. The base of N-channel transistor 332c is maintained at a bias voltage, $V_B$, which is the midpoint between the high and low voltages for the input signals, A and B. During the sampling phase of the clock signal CLK (i.e., CLKB>CLK), the voltage on the inverting latch output, QN, is equal to ($V_{cc}$–R·I) whenever N-channel transistor 332a or 332b is turned on, and is equal to $V_{cc}$ whenever N-channel transistors 332a and 332b are both turned off. Thus, the midpoint voltage on QP and QN is ($V_B = V_{cc} - R \cdot I_1/2$). The input signals, A and B, typically have the same signal swing as that of the latch output, QP and QN. Thus, the base of N-channel transistor 332c is biased to the midpoint voltage, $V_B$, which may be generated with current source 342 having half the current ($I_2 = I_1/2$) as current source 340 and a load resistor 338c having the same resistance ($R_2 = R$) as load resistors 338a and 338b.

Referring back to FIG. 3, latch 322 operates in similar manner as latch 222a. During the sensing phase, differential amplifier 332 is activated, which then senses the input signals, A and B, received at the bases of N-channel transistors 332a and 332b, respectively. The OR function provided by N-channel transistors 332a and 332b is described in further detail below. Differential amplifier 332 provides the OR of the values sensed on the input signals to the latch output, QP and QN. And during the latching phase, differential amplifier 334 is activated, which then maintains the value on the latch output.

The OR function is implemented as follows. The base of N-channel transistor 332c is maintained at the bias voltage, $V_B$, which is the midpoint between the high and low voltages for the input signals, A and B. If either A or B is at the high voltage, N-channel transistor 332a and/or 332b pulls the inverted latch output, QN, to a low voltage. The latch output, QP, thus transitions to the high voltage if either A or B, or both, are at high voltage. A truth table is also provided in FIG. 3 showing the value on the non-inverting latch output, QP, versus the values on the input signals, A and B.

For the design shown in FIG. 3, the integration of the OR function within latch 322 results in a change in the design of the latch. Latch 322 with the integrated OR gate receives single-ended input signals whereas latch 222a without the OR gate receives a differential input signal. For current-mode logic, the load resistance (R) and the bias current ($I_1$) may be selected such that the output signal swing is approximately 300 mV peak-to-peak. The input signals, A and B, typically also conform to this design and have 300 mVpp signal swing. However, since the base of N-channel transistor 332c is biased at the midpoint between the high and low voltages, or −150 mV from $V_{cc}$ for the design shown in FIG. 3, the differential voltage across the differential input of differential amplifier 332 is only ±150 mV, which is only half of the ±300 mV signal swing for the differential design shown in FIG. 2. This smaller signal swing across the differential input of differential amplifier 332 results in switching degradation, as described below.

Figure 4B:
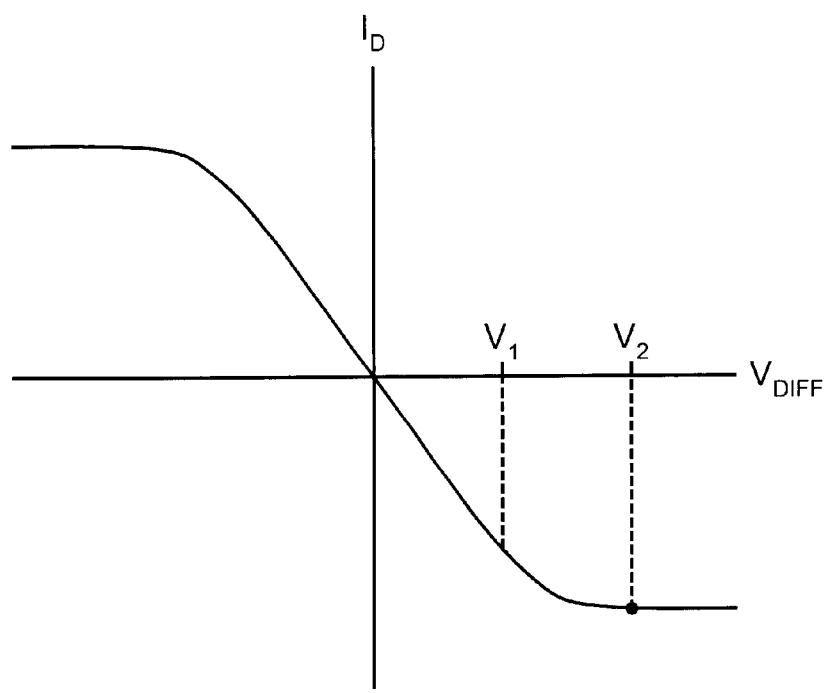
FIG. 4B is a plot of a transfer function for a CMOS differential amplifier.

FIG. 4B is a plot of a transfer function for a CMOS differential amplifier. The horizontal axis denotes the differential voltage, $V_{DIFF}$, across the differential input of the differential amplifier, with a positive value indicating that the voltage on the noninverting input (e.g., the gates of N-channel transistors 332a and 332b, where the input signals A and B are applied) is greater than the voltage at the inverting input (e.g., the gate of N-channel transistor 332c). The vertical axis denotes the drain current, $I_D$, through the differential amplifier, with a positive value indicating that the current is flowing across the non-inverting path (e.g., through N-channel transistor 332c) and a negative value indicating that the current is flowing across the inverting path (e.g., through N-channel transistor 332a or 332b). The transfer function is related to the small signal gain, $g_m$, of the CMOS transistor. The selected bias current ($I_1$), transistor sizes, and input signal differential swing may be optimized for a particular bandwidth, thus improving the differential characteristics of a particular stage. For instance, as seen in FIG. 4B, a larger signal swing across the differential input of the differential amplifier provides better switching performance in terms of more current drive (i.e., increased $I_D$).

When a differential input signal is applied across the differential input of the differential amplifier, a full signal swing (±$V_2$, which may be ±300 mV) is generated across the differential input. This larger differential input voltage causes the differential amplifier to switch more completely, which results in the voltages on the differential latch output, QP and QN, achieving larger signal swing. Conversely, when one input of the differential amplifier is biased at VB and a single-ended input signal is applied to the other input, the differential input swing would be reduced by one half (±$V_1$, which may be ±150 mV) across the differential input. This smaller differential input voltage causes the differential amplifier to switch less completely, which results in an increase in delay under output loading due to a reduction in signal switching current at the differential latch output, QP and QN. A different transfer function than the one shown in FIG. 4B may be obtained with different transistor sizes. Optimal performance results when the transistor sizes are minimized at a given bias current while still maintaining the signal switching bandwidth under the required loading conditions at the amplifier output.

Figure 5:
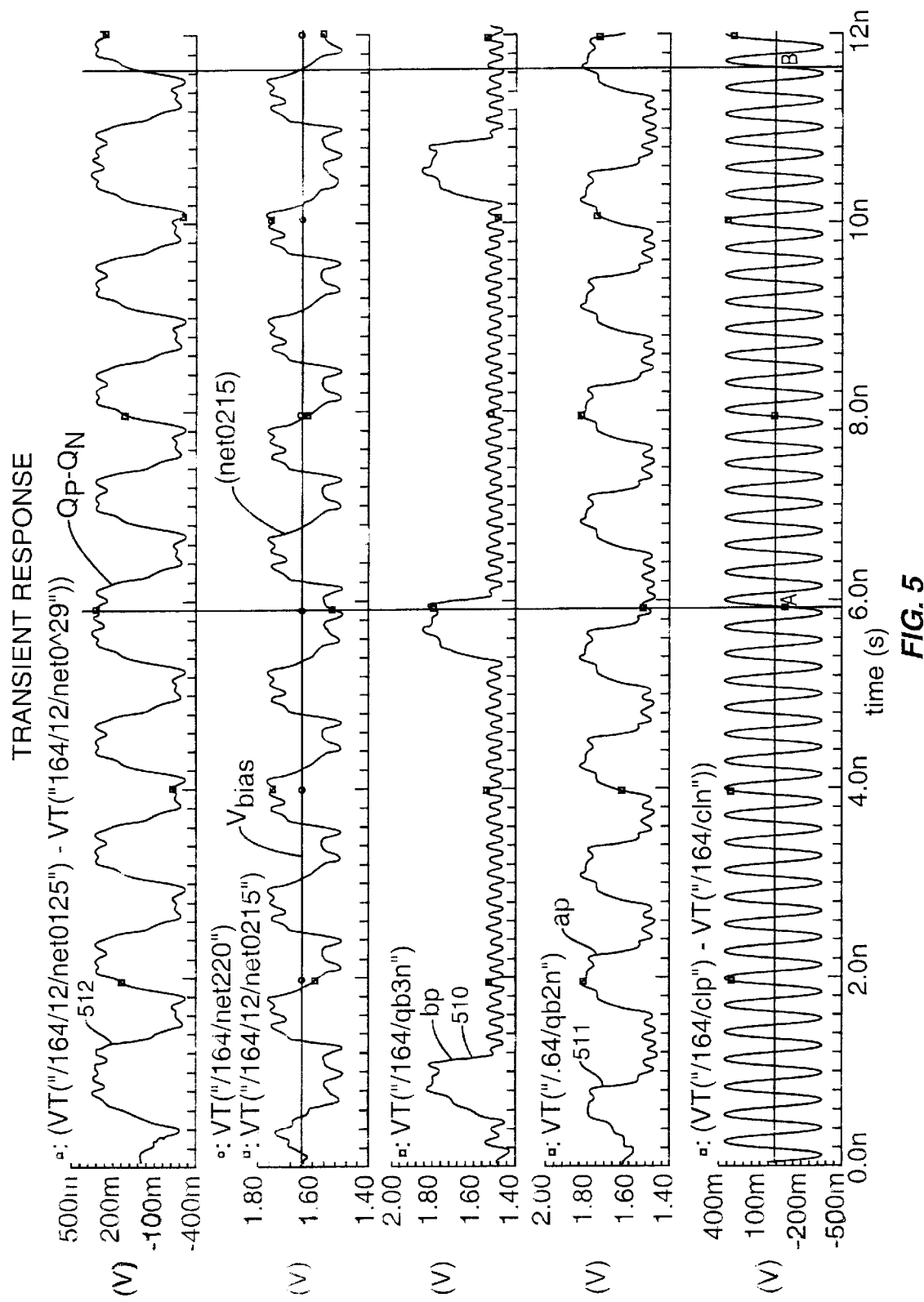
FIG. 5 includes plots illustrating the switching performance of the latches shown in FIGS. 3 and 6.

FIG. 5 shows plots illustrating the switching performance of latch 322. In FIG. 5, the horizontal axis denotes time, which is labeled in increments of 2.0 nsec, and the vertical axes denotes voltage. The single-ended input signals to the latch are shown by plots 510 and 511, and the different output signal (QP - QN) of the latch is shown by plot 512. The input signal across one side of the differential input of differential amplifier 332 is shown by plot 510, and the signal on the non-inverting latch output, QP, is shown by plot 512. Because the gate of N-channel transistor 332c is biased to the midpoint voltage, $V_B$, the signal swing across the differential input of differential amplifier 332 is approximately half (in comparison to a fully differential signal swing), and the switching performance of the output signal is degraded. Moreover, since a signal transition is applied to only one input of the differential amplifier while the other input is maintained at a fixed voltage (as oppose to both inputs being applied with signals for the fully differential design shown in FIG. 2), the switching speed of differential amplifier 332 is also slower. This degradation in switching performance is especially noticeable for high frequency applications.

Figure 6:
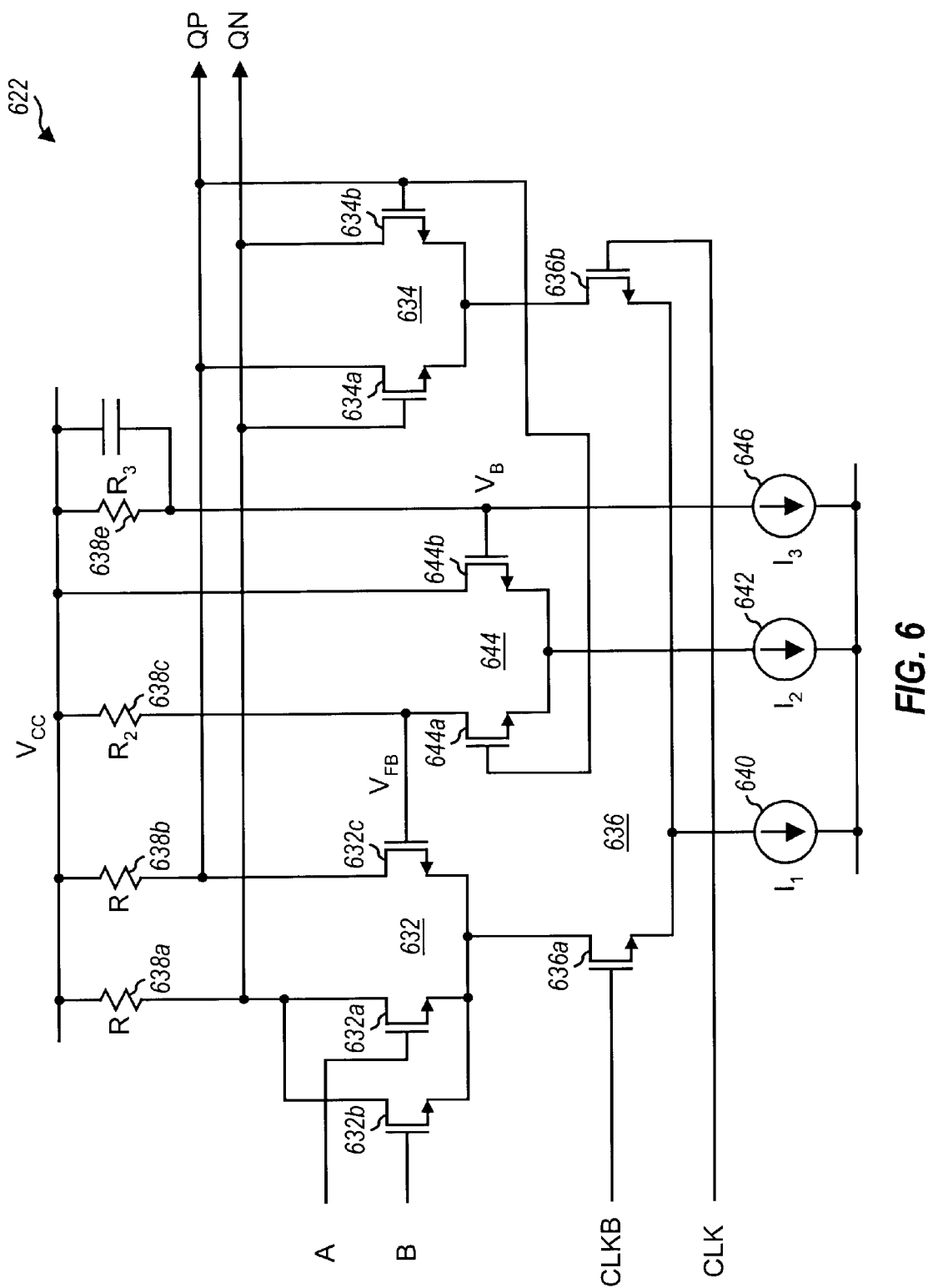
FIGS. 6 and 7A are schematic diagrams of a design of a latch with an integrated 2-input OR gate, in accordance with two embodiments of the invention.

FIG. 6 is a schematic diagram of a design of a latch 622 with an integrated 2-input OR gate, in accordance with an embodiment of the invention. Latch 622 includes an input differential amplifier 632 with integrated OR function, an output differential amplifier 634, and a clocked current-steering differential amplifier 636, which are similar to those for latch 322 in FIG. 3. However, latch 622 includes an additional "feedback" differential amplifier 644 provided to improve the switching performance of the latch.

Differential amplifiers 632, 634, and 636 are configured similar to differential amplifiers 332, 334, and 336 in FIG. 3. Feedback differential amplifier 644 includes N-channel transistors 644a and 644b having sources that coupled together and further to a current source 642, gates that respectively couple to QP and the bias voltage, $V_B$, and drains that respectively couple to load resistor 638c and $V_{cc}$. The drain of N-channel transistor 644a provides the feedback voltage, $V_{FB}$, and further couples to the gate of N-channel transistor 632c. The bias voltage, $V_B$, is generated relative to $V_{cc}$ by a current source 646 having a current of $I_3$ and a load resistor 638e having a resistance of $R_3$. A capacitor is coupled across resistor 638e to provide filtering.

Differential amplifiers 632, 634, and 636 of latch 622 operate in similar manner as those of latch 322. During the sensing phase, differential amplifier 632 is activated, which senses the input signals, A and B, applied to the bases of N-channel transistors 632a and 632b, respectively. Differential amplifier 632 then provides the sensed value to the latch output, QP and QN. And during the latching phase, differential amplifier 634 is activated, which maintains the value on the latch output.

Feedback differential amplifier 644 operates as follow. During the sensing phase, feedback differential amplifier 644 dynamically adjusts the voltage at the base of N-channel transistor 632c to improve switching performance. If input signals A and B are both at low voltage during the sensing phase, N-channel transistors 632a and 632b are both turned off, which causes QN to be at high voltage and QP to be at low voltage. The low voltage on QP turns off N-channel transistor 644a, which then causes the base of N-channel transistor 632c to be at high voltage.

Thereafter, during the sensing phase, if the input signal A or B is switched high, N-channel transistor 632a or 632b turns on, which begins to pull the voltage on QN lower and causes QP to transition high. The higher voltage on QP turns on N-channel transistor 644a, which then pulls the base of N-channel transistor 632c to low voltage. The low voltage on the base of N-channel transistor 632c and the high voltage on the base of N-channel transistor 632a and/or 632b result in a larger differential signal swing being applied across the differential input of differential amplifier 632. This larger signal swing improves the switching performance on the latch output, QP and QN. Differential amplifier 644 thus effectively provides positive feedback to cause QP to quickly transition from low to high voltage when the input signal A and/or B transitions high.

Conversely, when both input signals A and B transition back to low voltage during the next sensing phase, N-channel transistors 632a and 632b are turned off, and current is forced through N-channel transistor 632c. This then causes the voltage on QP to be pulled lower, which then turns off N-channel transistor 644a and causes the base of N-channel transistor 632c to go high. Again, positive feedback is applied to cause QP to quickly transition from high to low voltage when the input signals A and B transition low.

Feedback differential amplifier 644 may be viewed as a feedback circuit having an (inverting) input and an output. The inverting input is formed by the gate of N-channel transistor 644a and the output is formed by the drain of N-channel transistor 644a. Feedback differential amplifier 644 provides a signal inversion between QP, which is applied to the inverting input, and the output. Similarly, N-channel transistor 632c provides a signal inversion between the gate input and the drain output. Thus, positive feedback is generated around the feedback loop (i.e., from QP, through N-channel transistor 644a, further through N-channel transistor 632c, and back to QP).

In the embodiment shown in FIG. 6, feedback differential amplifier 644 is shown being biased with an amount of current (I2) that is different from that of input differential amplifier 632. Also, the size of N-channel transistors 644a and 644b can be different from that of N-channel transistors 632a, 632b, and 632c. A larger size for N-channel transistor 644a allows differential amplifier 644 to switch faster, but results in more capacitive loading on the drain of N-channel transistor 632c.

Feedback differential amplifier 644 improves the switching speed of latch 622, the switching performance of the latch, and the characteristics of the differential latch output signal, QP and QN. First, faster switching speed for the output signal is achieved through the use of (positive) feedback to dynamically adjust the voltage on the inverting input of the input differential amplifier (i.e., the base of N-channel transistor 632c) during a signal transition. This faster switching speed effectively increases the maximum operating frequency (i.e., the bandwidth) of the latch such that it may be driven by a higher clock speed. Second, the output signal (and thus the next stage) is driven harder because a full differential voltage is provided across the differential input of differential amplifier 632. This results in more efficient current steering between the two paths of differential amplifier 632, which further results in a faster rate of change in the voltages on load resistors 638. Third, improved noise margin is achieved for the output signal because of the larger differential input voltage level swing. Additional benefits may also be realized with the use of the feedback circuit.

Figure 7A:
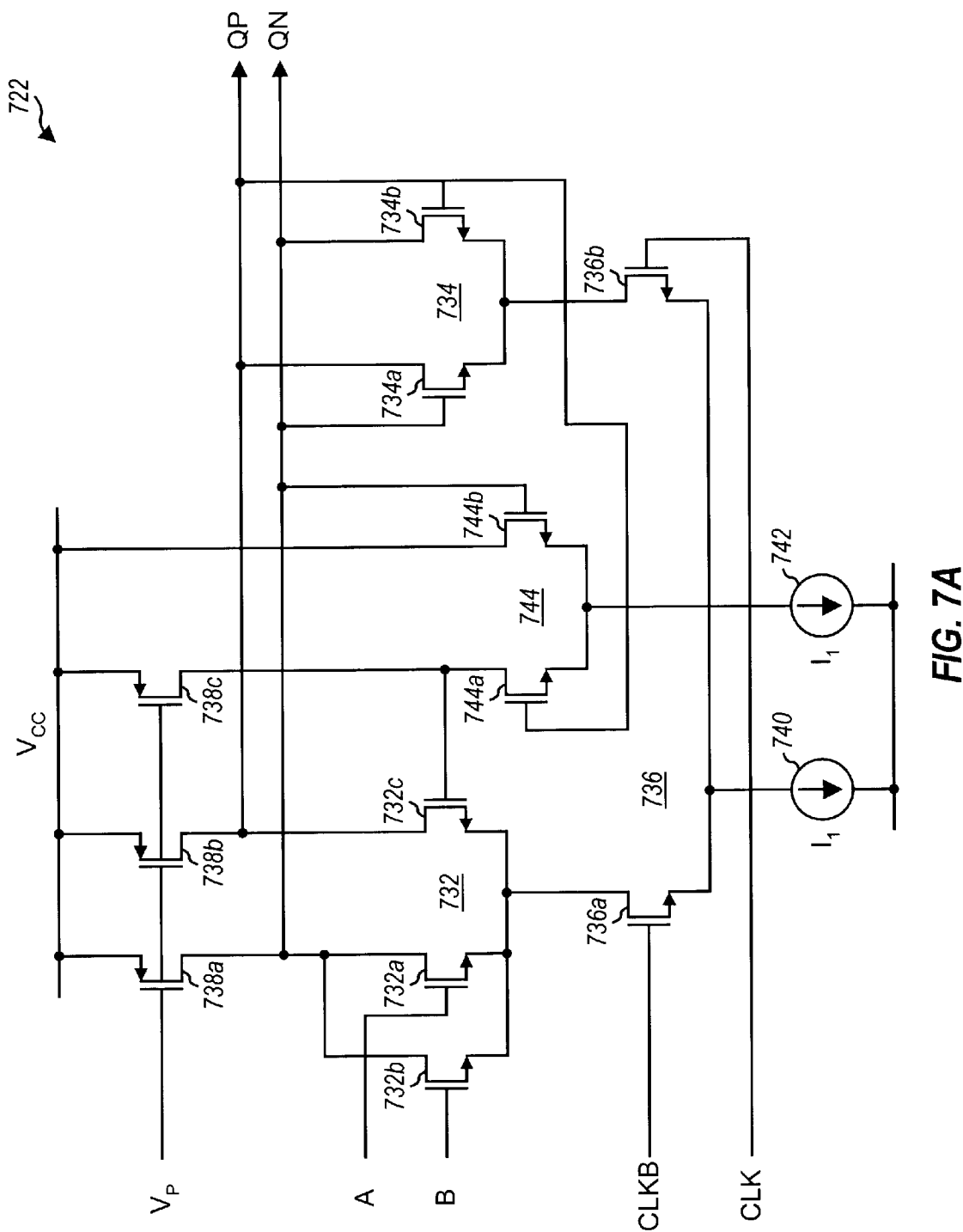

FIG. 7A is a schematic diagram of a design of a latch 722 with an integrated 2-input OR gate, in accordance with another embodiment of the invention. Latch 722 includes an input differential amplifier 732 with integrated OR function, an output differential amplifier 734, a clocked current-steering differential amplifier 736, and a feedback differential amplifier 744, which are similar to those for latch 622 in FIG. 6. However, latch 722 utilizes active loads biased in the triode region for differential amplifiers 732 and 744, which may be preferable for some designs.

As shown in FIG. 7A, the active loads are provided by P-channel transistors 738a, 738b, and 738c having sources that couple to $V_{cc}$, bases that couple together and to a control voltage, $V_p$, and sources that respectively couple to the sources of N-channel transistors 732a, 732c, and 744a. The control voltage, $V_p$, is generated by a replica bias circuit (described below) such that when the amount of required current flowing in the active circuit equals that in the replica stage, the common gate voltage ($V_p$) controls the drain voltages to a predefined level.

The active loads for the differential amplifiers may be advantageous for some designs and for some applications. The active loads may provide improved switching performance under some operating conditions and may be easier and less costly to implement than resistive loads. The active loads may further provide more accurate output voltages than resistive loads, due to limitation in obtaining accurate resistor values in a CMOS process. In certain other designs and applications, resistive loads may result in less capacitive loading and may thus provide better performance. Different designs, layouts, and processes may provide different results and different performance for active and resistive loads. The choice as to whether to use resistive or active loads may be dependent on various factors such as cost, performance, and others. The invention may be implemented with either active or resistive loads.

In the embodiment shown in FIG. 7A, feedback differential amplifier 744 includes N-channel transistors 744a and 744b having sources that coupled together and to a current source 742, gates that respectively couple to QP and QN, and drains that respectively couple to P-channel load transistor 738c and $V_{cc}$. This configuration for feedback differential amplifier 744 is different from the configuration for feedback differential amplifier 644 shown in FIG. 6. The base of N-channel transistor 744b is coupled to QN (instead of VB) and the drain of N-channel transistor 744b is coupled directly to VCC (instead of through a load).

The feedback configuration shown in FIG. 7A provides a full differential signal swing across the differential input of differential amplifier 744 during signal switching, which may provide improved switching performance. However, the switching improvement due to a larger signal swing may be negated by the extra capacitive loading resulting from the gate of N-channel transistor 744b being coupled to QN. For certain operating conditions, the feedback configuration shown in FIG. 7A may provide improved switching performance over the configuration shown in FIG. 6.

Figure 7D:
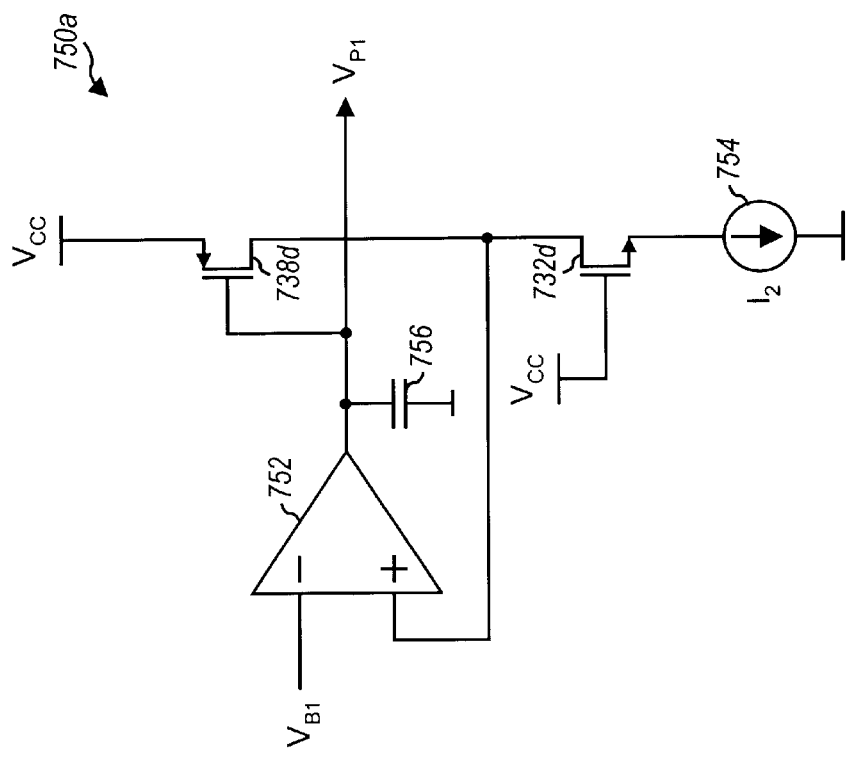
FIGS. 7B–7D is a schematic diagram of an embodiment of a replica bias circuit for generating a control voltage, $V_p$, for an active load.
Figure 7B:
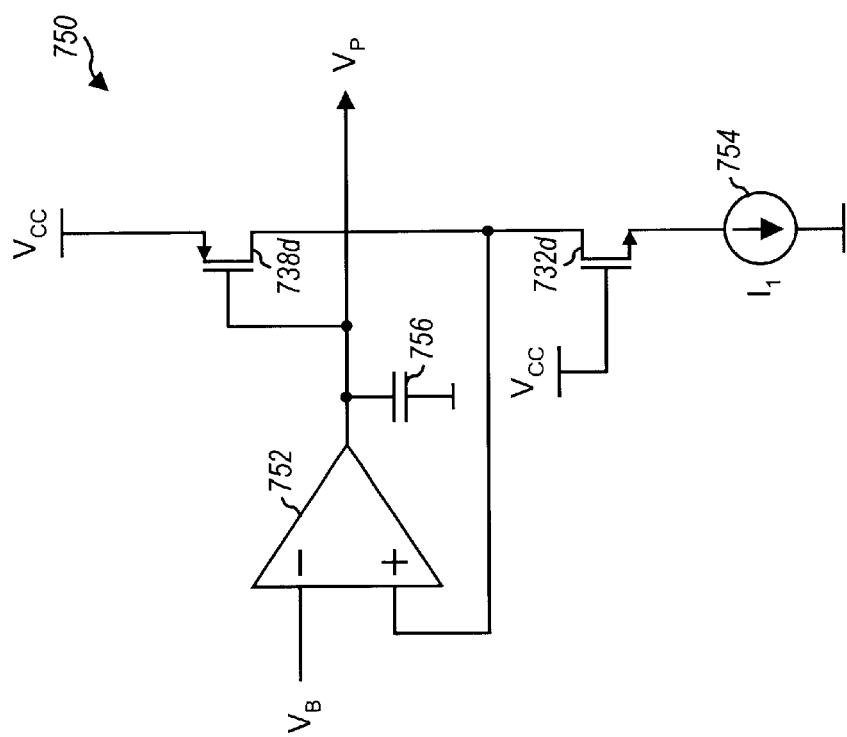

FIG. 7B is a schematic diagram of an embodiment of a replica bias circuit 750 for generating the control voltage, $V_P$. Replica bias circuit 750 includes a P-channel transistor 738d, an N-channel transistor 732d, a current source 754, and an operational amplifier (op-amp) 752. P-channel transistor 738d is a replica of one of P-channel transistors 738a, 738b, and 738c, which form the active loads for differential amplifiers 732 and 744 in FIG. 7A. N-channel transistor 732d is a replica of one of N-channel transistors 732a, 732b, and 732c of differential amplifier 732.

P-channel transistor 738d has its source coupled to $V_{cc}$, its gate coupled to the output of op-amp 752, and its drain coupled to the drain of N-channel transistor 732d. The gate of N-channel transistor 732d couples to $V_{cc}$, and the source couples to current source 754. Op-amp 752 is coupled in a negative feedback loop with transistors 732d and 738d, and has its inverting input coupled to the bias voltage, $V_B$, and its non-inverting input coupled to the drains of transistors 732d and 738d. The output of op-amp 752 comprises the control voltage, $V_P$. A capacitor 756 couples to the output of op-amp 752 and AC ground and provides filtering and compensation for the control voltage, $V_P$.

Replica bias circuit 750 operates as follow. The gate of N-channel transistor 732d is maintained at $V_{cc}$. Op-amp 752 senses the voltage at the drain of N-channel transistor 732d, compares this voltage with the bias voltage, $V_B$, received at its inverting input, and generates the control voltage, $V_P$, for application to the gate of P-channel transistor 738d such that the voltage at the drain of N-channel transistor 732d is maintained at $V_B$. The control voltage, $V_P$, thus provides the proper gate voltage to P-channel transistor 738d (which is operated in the triode region) such that its source-to-drain voltage, $V_{DS}$, generates the desired voltage drop from the supply voltage, $V_{cc}$, i.e., $V_P \rightarrow (V_{DS} = V_{CC} - V_B \approx 300$ mV).

Referring back to FIG. 7A, the drain to source voltage of transistor 738d in replica bias circuit 750 is also established in the active circuit of latch 722 when the same bias current, $I_1$, flows through transistor 738a or 738b. Thus, a well defined voltage level in the load is generated for proper signal propagation. For simplicity, current source 754 is shown to provide the same amount of current ($I_1$) as that of current source 740.

Figure 7C:
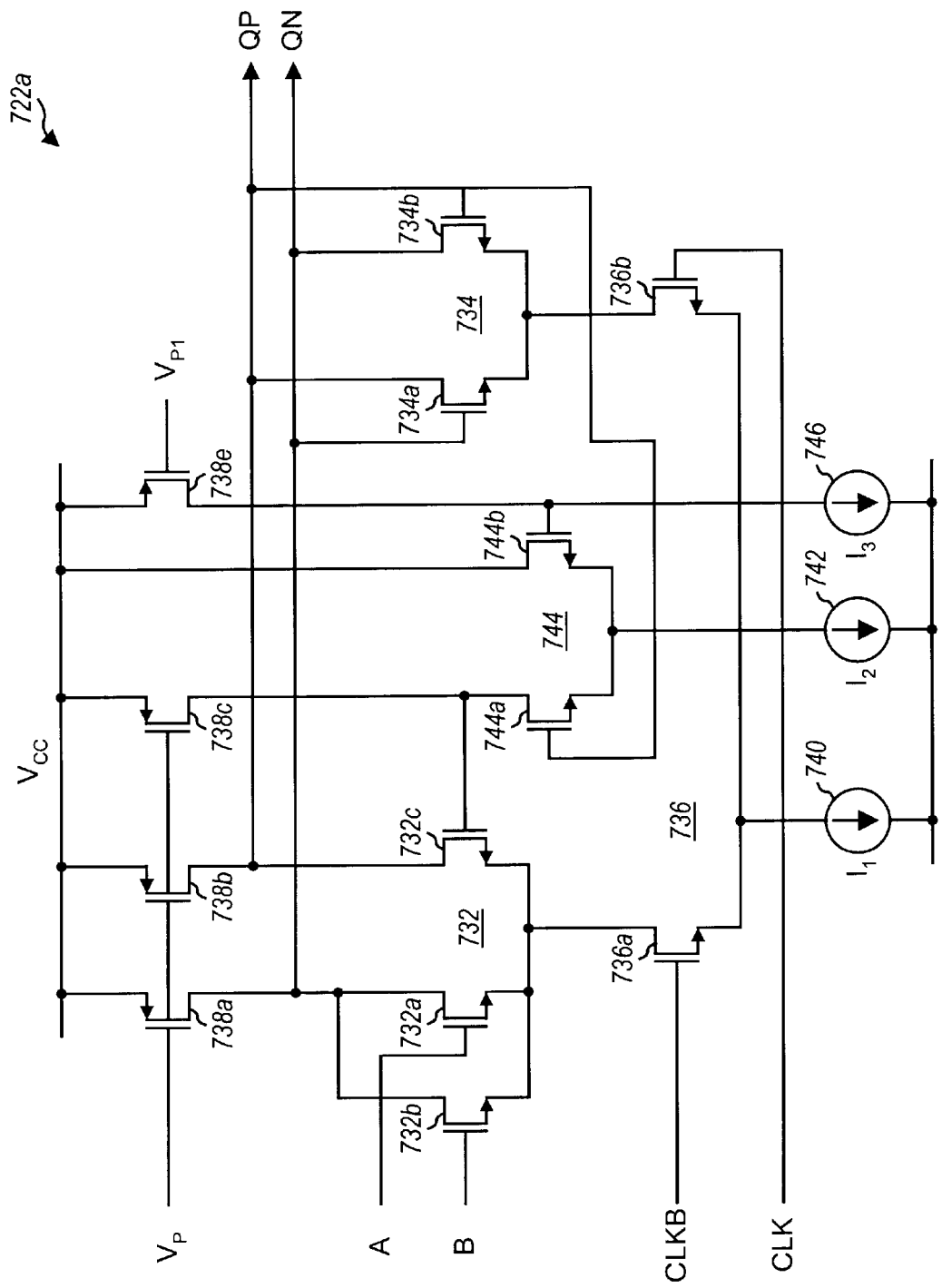

FIG. 7C is a schematic diagram of another design of a latch 722a with an integrated 2-input OR gate. Latch 722a is similar to latch 722 in FIG. 7A. However, the gate of transistor 744b is biased with a P-channel transistor 738e coupled in series with a current source 746. The active loads are provided by P-channel transistors 738a, 738b, 738c, and 738e having sources that couple to $V_{cc}$. The gates of transistors 738a, 738b, and 738c couple to the control voltage, $V_P$, and the drains of these transistors couple to the drains of transistors 732a, 732c, and 744a, respectively. The gate of transistor 738e couples to the control voltage, $V_{P1}$, and the drain couples to the gate of transistors 744b and to current source 746. The control voltages, $V_P$ and $V_{P1}$, are generated by replica bias circuits such that when the required amount of current flowing in the active circuit equals that in the replica stage, the drain to source voltages of the load are well defined. The control voltages are set as follows: $V_P = V_{cc} - \Delta V$, $V_{P1} = V_{cc} - \Delta V/2$, and $V_{P1}$ equals the midpoint value of the latch output (e.g., $\Delta V$ may equal 300 mV).

Figure 8:
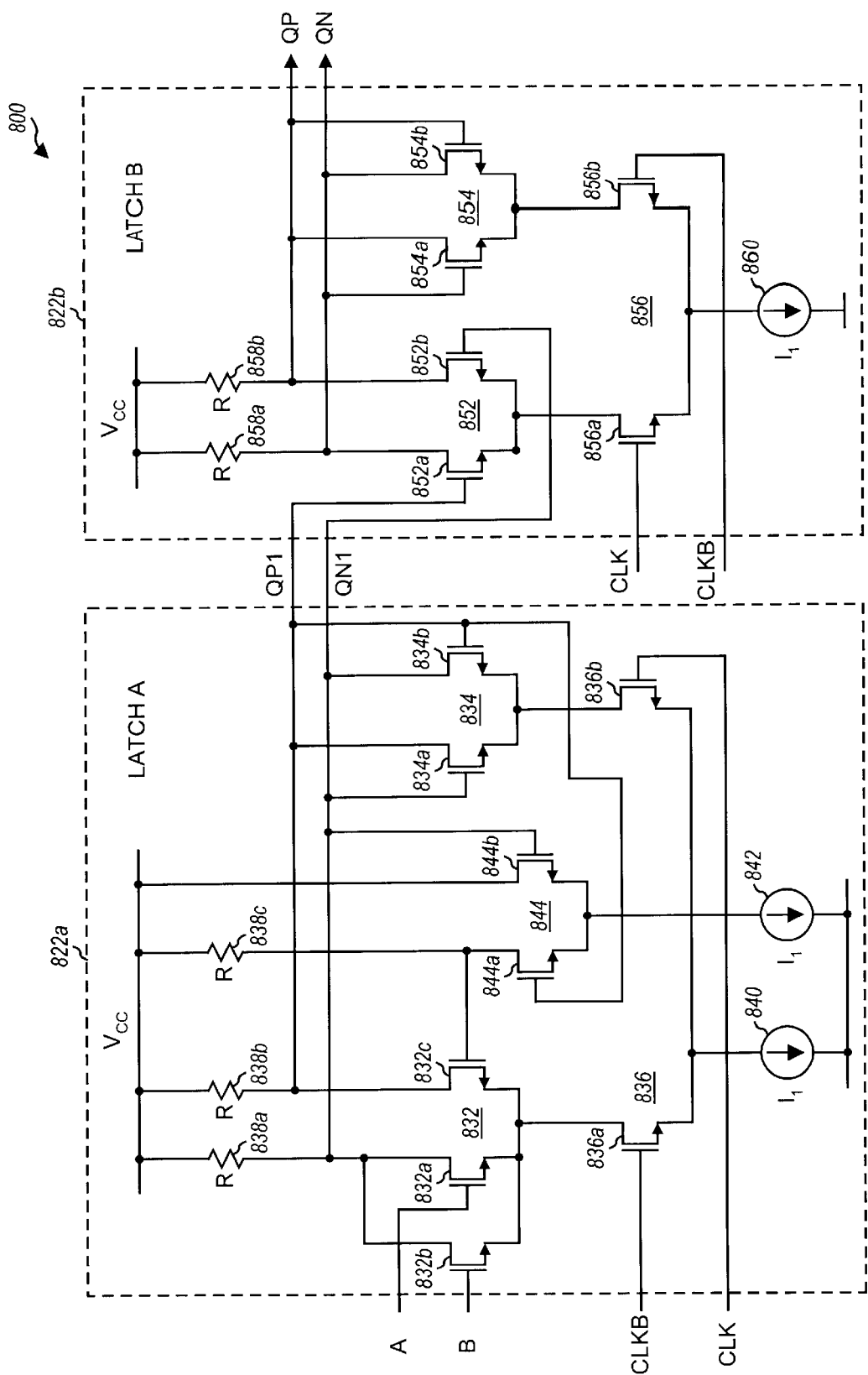
FIG. 8 is a schematic diagram of a D flip-flop with an integrated 2-input OR gate, in accordance with an embodiment of the invention.

FIG. 7D is a schematic diagram of a replica bias circuit 750a for generating the control voltage, $V_{P1}$. Replica bias circuit 750a is similar in design to replica bias circuit 750 in FIG. 7B. However, the bias voltage, $V_{B1}$, is provided to the non-inverting input of op-amp 752 instead of the bias voltage, $V_B$. FIG. 8 is a schematic diagram of a D flip-flop 800 with an integrated 2-input OR gate, in accordance with an embodiment of the invention. D flip-flop 800 includes two latches 822a and 822b coupled in series. Input latch 822a is similar in design to latch 622 in FIG. 6 and latch 722 in FIG. 7A, and includes an input differential amplifier 832 with integrated OR function.

Output latch 822b includes an input differential amplifier 852, an output differential amplifier 854, and a base differential amplifier 856. Input differential amplifier 852 couples to one path of base differential amplifier 856 and senses the value on the input signal, QP1 and QN1, during the sensing phase. Output differential amplifier 852 couples to the other path of base differential amplifier 856 and latches the sensed value during the latching phase. Output latch 822b performs the sensing and latching on the opposite phase of the clock signal, CLK, in comparison to input latch 822a.

Output latch 822b operates on a differential input signal, QP1 and QN1, which is the differential output from the preceding latch 822a. Sufficient signal swing and switching speed are provided by the signal, QP1 and QN1, and the switching enhancement feedback circuit (i.e., differential amplifier 844) is not implemented within output latch 822b.

The embodiments shown in FIGS. 6, 7A, and 8 show a 2-input OR gate being integrated within the input differential amplifier via an additional N-channel transistor. OR gate with more than two inputs may also be implemented by providing an additional N-channel transistor for each additional input of the OR gate. The additional N-channel transistor(s) increase the capacitive loading on QN, which may degrade the switching performance of the latch.

Figure 9A:
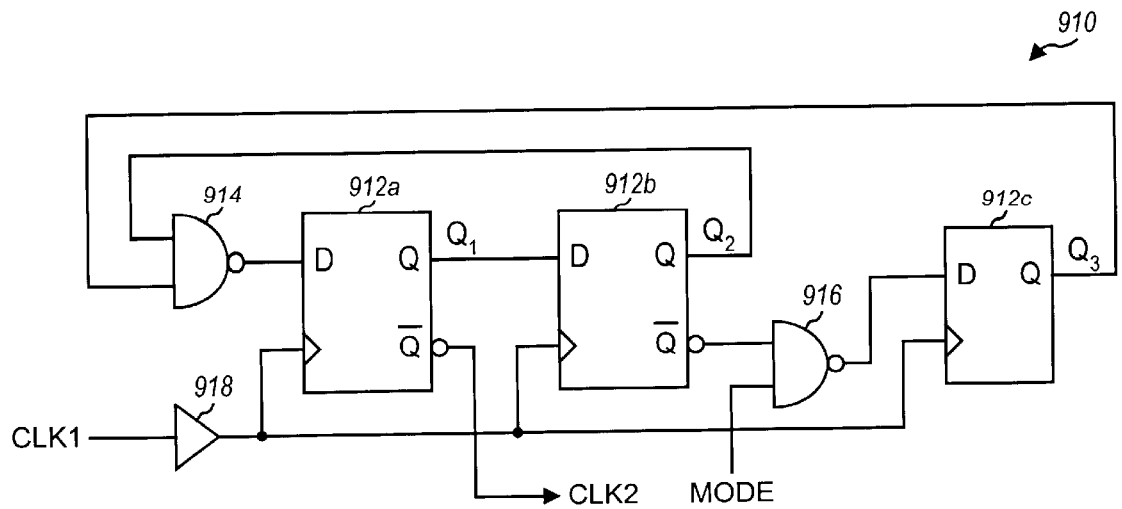
FIG. 9A is a diagram of a partial dual modulus divider, which may be integrated within a full dual modulus prescaler for use in a frequency synthesizer.

Other types of gates may also be integrated within the input differential amplifier. For example, a NOR gate may be implemented by providing the input signals to the inverting input of the differential amplifier (instead of the non-inverting input of the differential amplifier). Also, a NAND gate may be implemented with the use of P-channel transistors instead of N-channel transistors. FIG. 9A is a diagram of a partial dual modulus divider 910, which may be integrated within a full dual modulus prescaler for use in a frequency synthesizer. Dual modulus divider 910 is capable of dividing an input clock signal, CLK1, by either four or five depending on the value on a control signal, MODE.

Dual modulus divider 910 includes three D flip-flops 912a, 912b, and 912c coupled in series. A NAND gate 914 has two inputs that couple to the Q2 and Q3 outputs from D flip-flops 912b and 912c, respectively, and an output that couples to the D input of D flip-flop 912a. The output of latch 912a couples to the D input of latch 912b. A NAND gate 916 has one input that couples to the Q2/ output from D flip-flop 912b, another input that couples to the control signal, MODE, and an output that couples to the D input of D flip-flop 912c. The input clock signal, CLK1, is buffered by a buffer 918 and provided to the clock input of D flip-flops 912a, 912b, and 912c.

Figure 9B:
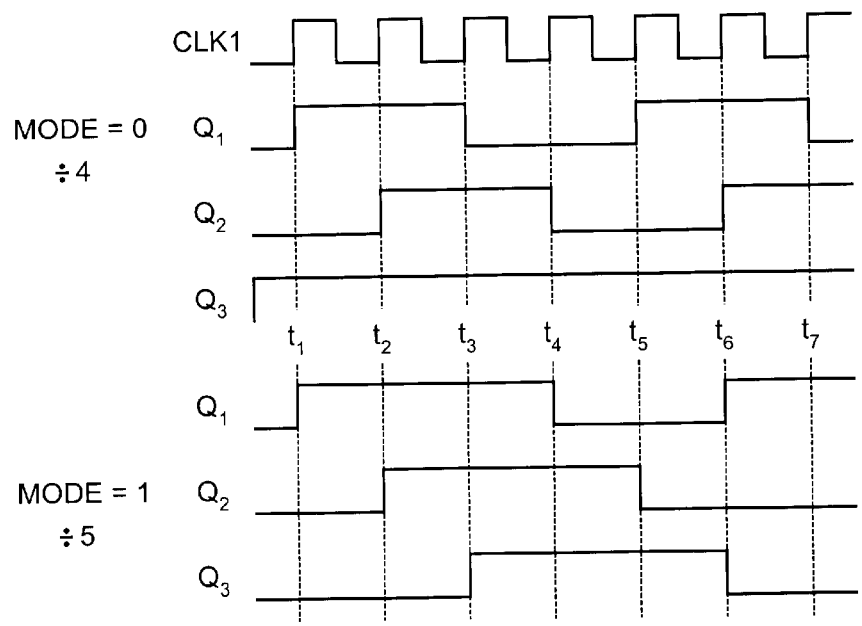
FIG. 9B is a timing diagram illustrating the operation of the dual modulus divider shown in FIG. 9A.

FIG. 9B is a timing diagram that illustrates the operation of dual modulus divider 910. When the control signal, MODE, is at logic low, NAND gate 916 is effectively disabled (i.e., the output of the NAND gate is maintained at logic high) and the Q3 output of D flip-flop 912c is also maintained at logic high. In this mode, D flip-flop 912c is not part of the feedback loop for dual modulus divider 910. Alternatively, when the control signal, MODE, is at logic high, NAND gate 916 is effectively enabled and the Q3 output of D flip-flop 912c is based on the Q2 output from the preceding D flip-flop 912b. In this mode, D flip-flop 912c becomes part of the feedback loop for dual modulus divider 910.

The upper half of FIG. 9B shows the signals for the divide-by-four mode (i.e., MODE=logic low). Initially, the Q1 and Q2 outputs from D flip-flops 912a and 912b are reset to logic low. At time $t_1$, the logic high at the output of NAND gate 914 (generated by Q2 being at logic low) is clocked into D flip-flop 912a. This high value is then clocked into D flip-flop 912b at time $t_2$. Since Q2 is now at logic high, the output of NAND gate 914 transitions to logic low, and this low value is clocked into D flip-flop 912a at time $t_3$. And at time $t_4$, the second logic high at Q2 results in a second logic low at the output of NAND gate 914, which is clocked into D flip-flop 912a. The divide-by-four is thus achieved by generating two consecutive high values with D flip-flops 912a and 912b, inverting the second high value with NAND gate 914, generating two low values with D flip-flops 912a and 912b, inverting the second low value with NAND gate 914, and so on.

The lower half of FIG. 9B shows the signals for the divide-by-five mode (i.e., MODE=logic high). Initially, the Q1, Q2, and Q3 outputs from D flip-flops 912a, 912b, and 912c are reset to logic low. At time $t_1$, the logic high at the output of NAND gate 914 is clocked into D flip-flop 912a. This high value is then clocked into D flip-flop 912b at time $t_2$ and into D flip-flop 912c at time $t_3$. When Q2 and Q3 are both at logic high, the output of NAND gate 914 transitions to logic low, and this low value is clocked into D flip-flop 912a at time $t_4$. And at time $t_5$, Q2 and Q3 are both still at logic high, the output of NAND gate 914 is still at logic low, and a second low value is clock into D flip-flop 912a. At the next clock cycle, Q2 has transitioned to logic low, the output of NAND gate 914 is at logic high, and a logic high is clocked into D flip-flop 912a at time $t_5$. The divide-by-five is thus achieved by rippling three consecutive high values through D flip-flops 912a, 912b, and 912c, and rippling two consecutive low values through the D flip-flops.

As shown in FIG. 9A, dual modulus divider 910 includes NAND gate 914 coupled to the D input of D flip-flop 912a and NAND gate 916 coupled to the D input of D flip-flop 912c. To operate at high clock speed, the delay between the output of one D flip-flop and the input of the following D flip-flop should be minimized. For dual modulus divider 910, reduced delay can be achieved by integrating NAND gate 914 into D flip-flop 912a and integrating NAND gate 916 into D flip-flop 912c.

Figure 10:
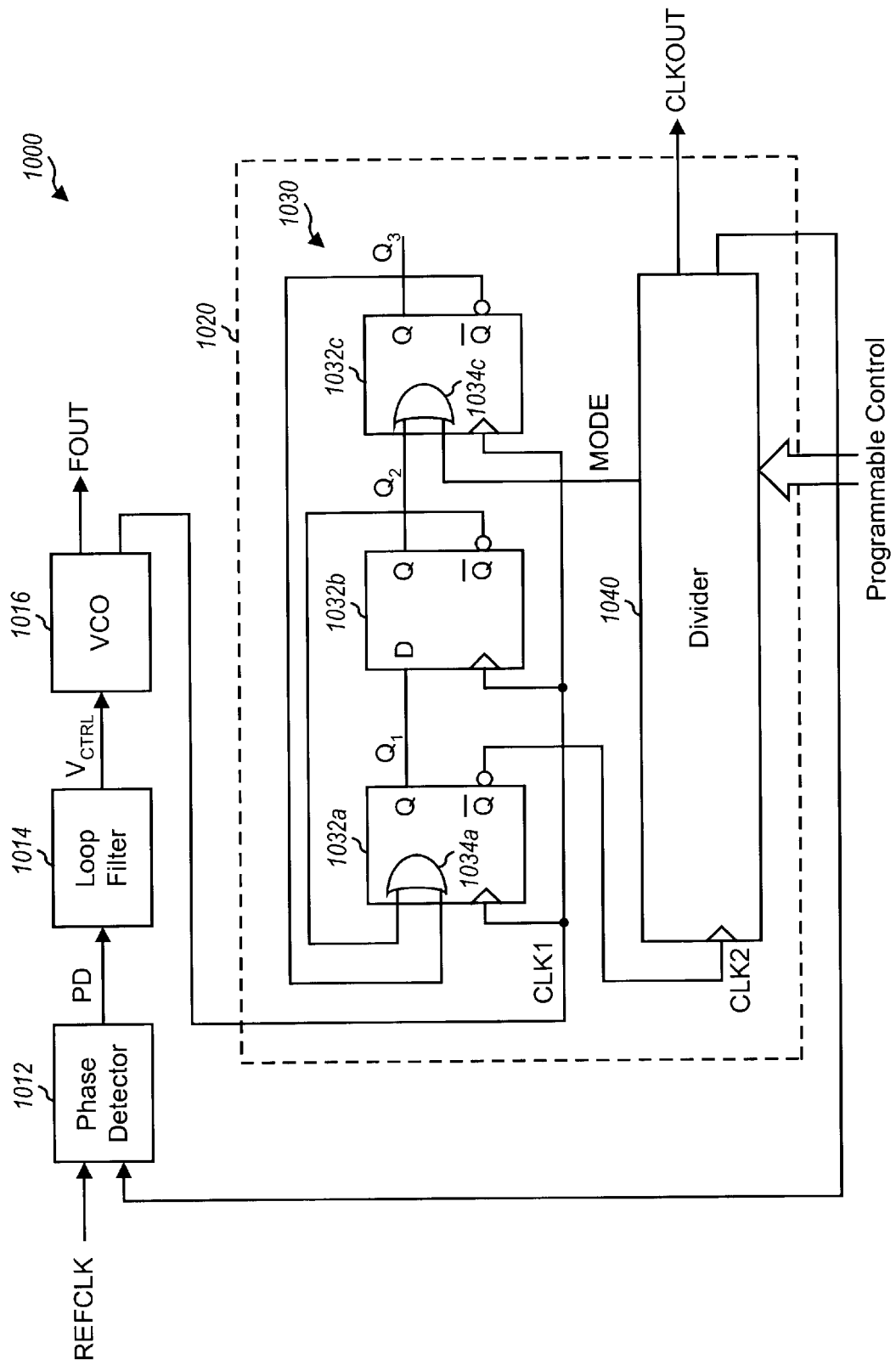
FIG. 10 is a block diagram of a phase-locked loop (PLL) frequency synthesizer utilizing D flip-flops with integrated gates.

FIG. 10 is a block diagram of a phase-locked loop (PLL) frequency synthesizer 1000 utilizing D flip-flops with integrated gates. Frequency synthesizer 1000 may be employed in various applications such as a wireless, networking, and so on. Frequency synthesizer 1000 may be used to generate a local oscillator (LO) signal, FOUT, and/or an output clock signal, CLKOUT, which are locked to a reference clock signal, REFCLK.

As shown in FIG. 10, frequency synthesizer 1000 includes a phase detector 1012, a loop filter 1014, a voltage controlled oscillator (VCO) 1016, and a divider 1020. Phase detector 1012 receives the reference clock, REFCLK, and a divided clock from divider 1020, compares the two received clocks, and provides an output, PD, indicative of the difference in phase (or frequency) between the two received clocks. Loop filter 1014 receives and filters the phase detector output, PD, with a particular lowpass filter and provides a control signal, $V_{CTRL}$. VCO 1016 receives the control signal, $V_{CTRL}$, and adjusts its frequency of oscillation based on the control signal. VCO 1016 further provides the LO signal, FOUT, which may be a buffered (and possibly a divided down) version of the internal clock signal. VCO 1016 also provides to divider 1020 the clock signal, CLK1, which is another buffered and (possibly divided down) version of the internal clock signal.

In the embodiment shown in FIG. 10, divider 1020 includes a dual modulus divider 1030 coupled to a lower divider 1040. Dual modulus divider 1030 includes three D flip-flops 1032a, 1032b, and 1032c coupled in series. D flip-flops 1032a and 1032c each includes an integrated 2-input OR gate at its data input, which is symbolically shown by the OR gate within the D flip-flop in FIG. 10. OR gate 1034c within D flip-flop 1032c implements NAND gate 916 in FIG. 9A. Dual modulus divider 1030 can divide the clock signal, CLK1, by either four or five, depending on a control signal, MODE, provided by divider 1040. Dual modulus divider 1030 can also divide (over many cycles) the clock signal, CLK1, by an average value K that is between 4 and 5 (i.e., 4<K<5) by dynamically adjusting the control signal, MODE.

The Q/ output from D flip-flop 1032a is provided as a prescaled clock signal, CLK2, which is used to drive lower divider 1040. Divider 1040 divides the prescaled clock signal, CLK2, by a factor of M, where M can be any value one or greater. Divider 1040 further controls the operation of dual modulus divider 1030 (i.e., to divide by either four or five) via the control signal, MODE. By dynamically controlling the divide-by-M operation of divider 1040 and the divide-by-K operation of divider 1030, any overall divide-by-N value may be achieved (where N needs not be an integer). This allows frequency synthesizer 1000 to generate any desired output frequency and channel spacing relative to the reference clock. VCO 1016 may be designed with the capability to tune within a particular frequency range (i.e., $\Delta f$), and the divide-by-N operation of divider 1020 may be selected to generate LO and output clock signals at various frequencies (e.g., corresponding to different channel spacing within a wireless application).

Dual modulus divider 1030 is equivalent to dual modulus divider 910 in FIG. 9, but includes several improvements. NAND gate 914 in divider 910 is implemented with an "inverted input" OR gate 1034a within D flip-flop 1032a. The inverted input is achieved by taking the Q/ signals (instead of the Q signals) from D flip-flops 1032b and 1032c. And OR gate 916 in divider 910 is implemented with an OR gate 1034c within D flip-flop 1032c.

By integrating NAND gate 914 and OR gate 916 in dual modulus divider 910 within D flip-flops 1034a and 1034c, respectively, in dual modulus divider 1030, delay is reduced and D flip-flops 1034 may be operated at a higher clock frequency. Furthermore, by employing a feedback circuit in the implementation of the OR gate within each of D flip-flops 1032a and 1032c, improved switching performance is obtained and the D flip-flops may be operated at even higher frequency. These improvements allow for the design of a high-speed frequency synthesizer in a (relatively) slower CMOS process.

For clarity, various aspects of the high-speed latch with integrated gate have been described using CMOS designs. However, the techniques described herein may also be applied to circuits implemented using other types of transistor such as, for example, bipolar, GaAs, and others.

The high-speed latch with integrated gate can be used for various applications including wireless, networking, and other applications. The feedback circuit within the latch can provide improved switching performance, especially for high frequency applications and low voltage designs (e.g., low voltage differential signal (LVDS) design). The high-speed latch with integrated gate can be used to implement various logic functions, and the prescaler described herein is one example application. The high-speed latch with integrated gate may be employed in an RF circuit, an application specific integrated circuit (ASIC), a digital signal processor, a microprocessor, a controller, a memory device, and so on.

The foregoing description of the specific embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein, and as defined by the following claims.

What is claimed is:

1. A latch comprising:
   a first differential amplifier having a plurality of first inputs and a second input, the first differential amplifier configured to receive and sense input signals applied to the plurality of first inputs and provide a differential output;
   a second differential amplifier operatively coupled to the first differential amplifier and configured to maintain the differential output; and
   a feedback circuit operatively coupled to the first and second differential amplifiers, the feedback circuit configured to detect the differential output and provide a control signal for the second input of the first differential amplifier.

2. The latch of claim 1, further comprising:
   a fourth differential amplifier operatively coupled to the first and second differential amplifiers, the fourth differential amplifier configured to receive a differential clock signal, activate the first differential amplifier during a sensing phase, and activate the second differential amplifier during a latching phase.

3. The latch of claim 1, wherein the plurality of first inputs is formed by gates of a plurality of transistors configured to implement a particular logic function.

4. The latch of claim 3, wherein the plurality of transistors are coupled in parallel and form an OR function for the input signals.

5. The latch of claim 1, wherein the control signal dynamically adjusts the second input of the first differential amplifier during a signal transition to provide improved switching performance.

6. The latch of claim 1, wherein the control signal dynamically adjusts the second input of the first differential amplifier to a voltage opposite in polarity from a voltage generated by a particular logic function of the input signals.

7. The latch of claim 1, wherein the feedback circuit provides positive feedback between the differential output and the second input of the first differential amplifier.

8. The latch of claim 1, wherein the feedback circuit is implemented as a third differential amplifier.

9. The latch of claim 8, wherein the third differential amplifier includes an inverting input and an output, wherein the inverting input of the third differential amplifier couples to a non-inverting node of the differential output, and wherein the output of the third differential amplifier couples to the second input of the first differential amplifier.

10. The latch of claim 1, and implemented in complementary metal oxide semiconductor (CMOS).

11. The latch of claim 1, and implemented using current-mode logic (CML).

12. A latch comprising:
   a first differential amplifier comprising first, second, and third transistors, wherein the first and second transistors couple in parallel and form a particular logic function, and wherein the first and third transistors have sources that couple together, gates that respectively form non-inverting and inverting latch inputs, and drains that respectively form inverting and non-inverting latch outputs;
   a second differential amplifier comprising fourth and fifth transistors having sources that couple together, gates that respectively couple to the inverting and non-inverting latch outputs, and drains that respectively couple to the non-inverting and inverting latch outputs; and
   a third differential amplifier comprising sixth and seventh transistors having sources that couple together, wherein the sixth transistor includes a gate that couples to the non-inverting latch output and a drain that couples to the gate of the third transistor.

13. The latch of claim 12, further comprising:
   a fourth differential amplifier comprising eight and ninth transistors having sources that couple together, gates that respectively form inverting and non-inverting clock inputs, and drains that respectively couple to sources of the first and second differential amplifiers.

14. The latch of claim 12, wherein the first and second transistors provide an OR function for input signals applied to the gates of the transistors.

15. The latch of claim 12, wherein the seventh transistor includes a gate that couples to a bias voltage.

16. The latch of claim 12, wherein the seventh transistor includes a gate that couples to the inverting latch output.

17. The latch of claim 12, further comprising: active loads for the first and third differential amplifier.

18. The latch of claim 12, further comprising: resistive loads for the first and third differential amplifier.

19. The latch of claim 12, wherein the transistors are implemented in complementary metal oxide semiconductor (CMOS).

* * * * *